United States Patent
Sugimoto et al.

(10) Patent No.: US 11,086,437 B2
(45) Date of Patent: Aug. 10, 2021

(54) CAPACITANCE DETECTION CIRCUIT AND ELECTROSTATIC CAPACITANCE SENSOR DEVICE WITH A HIGH-PASS FILTER HAVING FIRST AND SECOND PASSIVE CIRCUIT ELEMENTS FOR OUTPUTTING AN ATTENUATED CURRENT SIGNAL

(71) Applicant: TIANMA JAPAN, LTD., Kanagawa (JP)

(72) Inventors: Daisuke Sugimoto, Kawasaki (JP); Hiroshi Haga, Kawasaki (JP)

(73) Assignees: Wuhan Tianma Micro-Electronics Co., Ltd., Wuhan (CN); Tianma Japan, Ltd., Kanagawa (JP)

( * ) Notice: Subject to any disclaimer, the term of this patent is extended or adjusted under 35 U.S.C. 154(b) by 50 days.

(21) Appl. No.: 16/245,417

(22) Filed: Jan. 11, 2019

(65) Prior Publication Data
US 2019/0220132 A1    Jul. 18, 2019

(30) Foreign Application Priority Data
Jan. 12, 2018    (JP) .............................. JP2018-003439

(51) Int. Cl.
*G06F 3/041* (2006.01)
*G06F 3/044* (2006.01)
(Continued)

(52) U.S. Cl.
CPC ..... *G06F 3/0416* (2013.01); *G01R 19/16547* (2013.01); *G01R 27/2605* (2013.01);
(Continued)

(58) Field of Classification Search
CPC ........ G06F 3/0416; G06F 3/044; G06F 3/016; G06F 3/0412; G06F 3/04182; G01R 27/2605; G01R 19/16547
See application file for complete search history.

(56) References Cited

U.S. PATENT DOCUMENTS

| | | | |
|---|---|---|---|
| 2005/0206565 A1* | 9/2005 | Osaka ..................... | G06F 3/044 342/433 |
| 2010/0182273 A1* | 7/2010 | Noguchi ............... | G06F 3/0412 345/174 |

(Continued)

FOREIGN PATENT DOCUMENTS

| | | |
|---|---|---|
| JP | 2015-213273 A | 11/2015 |
| WO | 2014/002405 A1 | 1/2014 |

*Primary Examiner* — David D Davis
(74) *Attorney, Agent, or Firm* — Sughrue Mion, PLLC

(57) ABSTRACT

A capacitance detection circuit includes an excitation signal source configured to supply an AC driving voltage to drive the detection electrode, a high-pass filter configured to cause a current signal input from the detecting electrode to be output after being attenuated in a prescribed frequency region that is lower than a frequency of the excitation signal source, and a current signal measurement circuit connected between the high-pass filter and the excitation signal source. The current signal measurement circuit is configured to measure a current signal from the high-pass filter. The high-pass filter includes a first passive circuit element connected in series between the detection electrode and the current signal measurement circuit, and a second passive circuit element connected in series between the excitation signal source and a node between the detection electrode and the first passive circuit element.

9 Claims, 15 Drawing Sheets

(51) Int. Cl.
*G01R 27/26* (2006.01)
*G01R 19/165* (2006.01)
*G06F 3/01* (2006.01)

(52) U.S. Cl.
CPC .............. *G06F 3/016* (2013.01); *G06F 3/044* (2013.01); *G06F 3/0412* (2013.01)

(56) References Cited

U.S. PATENT DOCUMENTS

| | | | |
|---|---|---|---|
| 2011/0128254 A1* | 6/2011 | Teranishi | G06F 3/044 345/174 |
| 2014/0225848 A1 | 8/2014 | Ogura et al. | |
| 2016/0282991 A1* | 9/2016 | Wu | G06F 3/041662 |
| 2017/0300168 A1* | 10/2017 | Wu | G06F 3/0446 |
| 2018/0113511 A1* | 4/2018 | Haga | G06F 3/016 |

* cited by examiner

COMPARISON EXAMPLE 1

COMPARISON EXAMPLE 2

COMPARISON EXAMPLE 3

CAPACITANCE DETECTION CIRCUIT AND ELECTROSTATIC CAPACITANCE SENSOR DEVICE WITH A HIGH-PASS FILTER HAVING FIRST AND SECOND PASSIVE CIRCUIT ELEMENTS FOR OUTPUTTING AN ATTENUATED CURRENT SIGNAL

CROSS-REFERENCE TO RELATED APPLICATIONS

This non-provisional application claims priority under 35 U.S.C. § 119(a) on Patent Application No. 2018-003439 filed in Japan on Jan. 12, 2018, the entire content of which is hereby incorporated by reference.

BACKGROUND

The present disclosure relates to a capacitance detection circuit and an electrostatic capacitance sensor device.

In recent years, against the background of widespread use of smart phones and tablet devices, a touch panel is more and more widely recognized as a user interface with high usability. Touch panels are used for the display unit of various electronic devices.

For example, a touch sensor disclosed in Japanese Patent Application Laid-open Publication No. 2015-213273 includes a detection circuit, a conversion circuit, and a connection node between the detection circuit and the conversion circuit. The detection circuit has the function of changing the potential of the connection node, and the conversion circuit has the function of detecting an electric current generated at the connection node. The conversion circuit includes a capacitance that removes the DC component.

The technology of presenting a tactile sense on the surface of a touch panel by an electrostatic force is proposed. For example, WO2014/002405 discloses a tactile sense presentation device that is configured to present a tactile sense on the surface of the touch panel. In the tactile sense presentation device of WO2014/002405, a plurality of electrodes are arranged horizontally, and in one period, a voltage to detect the touch position is supplied to the plurality of electrodes, and in the other period, a voltage to present the tactile sense is supplied to the plurality of electrodes.

SUMMARY

An aspect of the present disclosure is a capacitance detection circuit that measures a current from a detection electrode in order to measure a self-capacitance of the detection electrode. The capacitance detection circuit includes an excitation signal source configured to supply an AC driving voltage to drive the detection electrode, a high-pass filter configured to cause a current signal input from the detecting electrode to be output after being attenuated in a prescribed frequency region that is lower than a frequency of the excitation signal source, and a current signal measurement circuit connected between the high-pass filter and the excitation signal source. The current signal measurement circuit is configured to measure a current signal from the high-pass filter. The high-pass filter includes a first passive circuit element connected in series between the detection electrode and the current signal measurement circuit, and a second passive circuit element connected in series between the excitation signal source and a node between the detection electrode and the first passive circuit element.

It is to be understood that both the foregoing general description and the following detailed description are exemplary and explanatory and are not restrictive of this disclosure.

DETAILED DESCRIPTION OF THE EMBODIMENTS

Hereinafter, embodiments of this disclosure will be described with reference to the accompanying drawings. The embodiments are merely examples to implement this disclosure and are not to limit the technical scope of this disclosure. Elements common to the drawings are denoted by the same reference signs. The drawings may exaggerate the sizes and the shapes of the elements for clarity of explanation. In each drawing, only a part of the elements of the same kind may be indicated with a reference sign.

Figure 1:
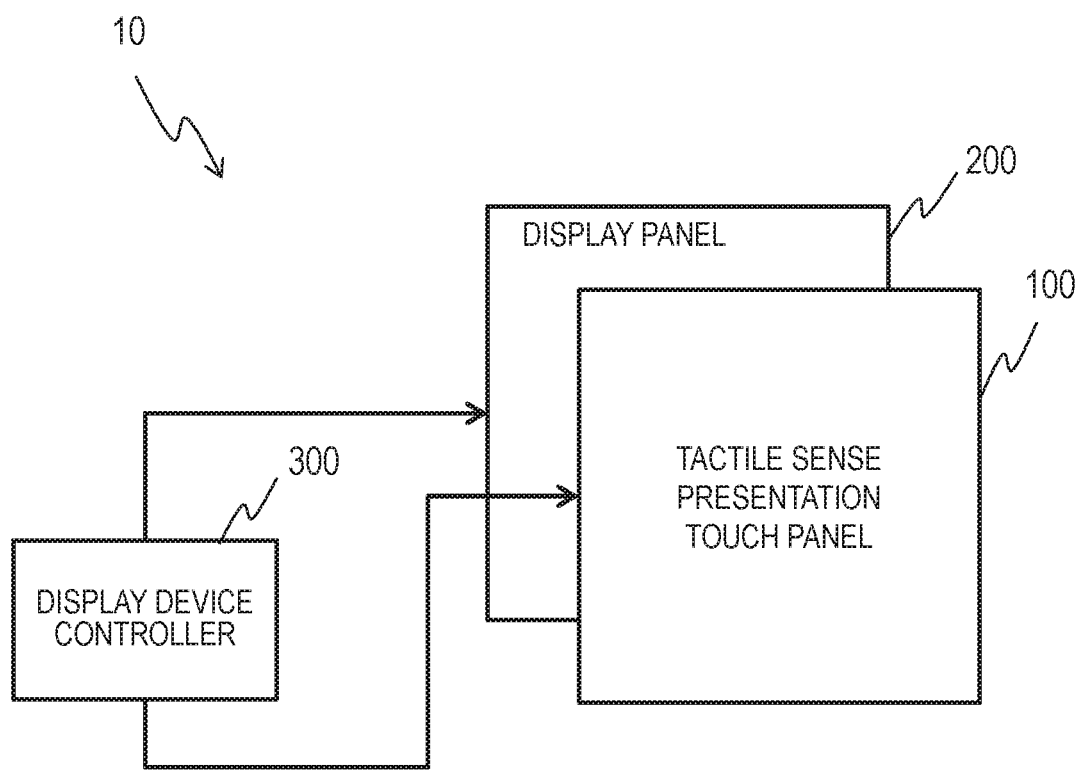
FIG. 1 is a schematic diagram illustrating a configuration example of a display device of the present disclosure.

FIG. 1 is a schematic diagram illustrating a configuration example of a display device of the present disclosure. The display device 10 includes: a display panel 200 configured to display an image; a tactile sense presentation touch panel 100 arranged on the front side (user side) of the display panel 200; and a display device controller 300 connected to the display panel 200 and the tactile sense presentation touch panel 100 and configured to control the display panel 200 and the touch panel 100.

The tactile sense presentation touch panel 100 doubles as the touch panel to detect a touch position on the touch surface and the tactile sense presentation panel that presents a tactile sense for a finger that makes contact with the touch surface. The tactile sense presentation touch panel 100 gives the finger with a texture feeling by the electrostatic force that oscillates at a prescribed frequency, which is generated between the X electrode and the Y electrode. The X electrodes and the Y electrodes are used both to detect a touch position and to give a texture feeling.

Examples of the display panel 200 include a liquid crystal display panel, an OLED (organic light emitting diode) display panel, and various other types of display panels. The display device controller 300 displays an image on the display panel 200 based on the image data input from the outside. The display device controller 300 controls the touch panel 100 so that the touch position of a finger on the touch surface of the tactile sense presentation touch panel 100 is detected, and the tactile sense is presented in a specific target area.

Figure 2:
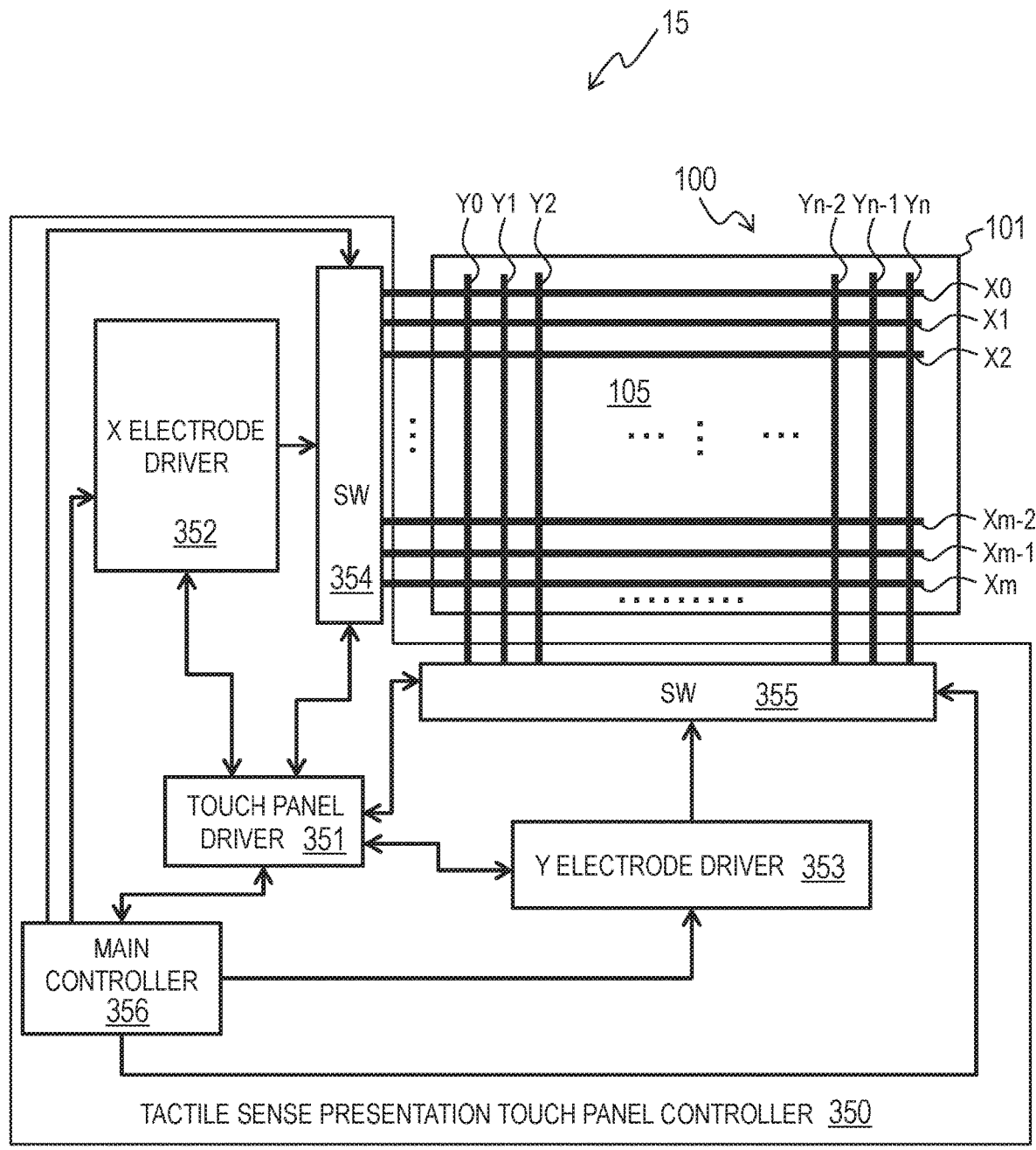
FIG. 2 schematically illustrates the logical configuration example of a tactile sense presentation touch panel device included in the display device 10.

FIG. 2 schematically illustrates the logical configuration example of a tactile sense presentation touch panel device 15 included in the display device 10. The tactile sense presentation touch panel device 15 includes the tactile sense presentation touch panel 100 and a tactile sense presentation touch panel controller 350 that controls the tactile sense presentation touch panel 100. The tactile sense presentation touch panel controller 350 is a part of the display device controller 300.

The tactile sense presentation touch panel controller 350 includes a touch panel driver 351 (touch detection circuit). The touch panel driver 351 controls the operation of the X electrodes X0 to Xm and the Y electrodes Y0 to Yn to detect an object making contact with the touch surface 105. m and n are each a natural number. The touch panel driver 351 is a circuit provided to realize the function of a touch panel for detecting an object making contact with the touch surface 105 using the X electrodes X0 to Xm and the Y electrodes Y0 to Yn.

The tactile sense presentation touch panel controller 350 includes an X electrode driver 352 for controlling the operation of the X electrodes X0 to Xm so as to cause the touch surface 105 to present a texture feeling, and a Y electrode driver 353 for controlling the operation of the Y electrodes Y0 to Yn so as to cause the touch surface 105 to present a texture feeling.

The X electrode driver 352 and the Y electrode driver 353 are circuits for presenting a texture feeling on the touch surface 105 using the X electrodes X0 to Xm and the Y electrodes Y0 to Yn. As described above, the X electrodes X0 to Xm and the Y electrodes Y0 to Yn double as the detection electrodes for detecting a touch position and the tactile sense presentation electrodes for presenting a tactile sense.

The tactile sense presentation touch panel controller 350 includes a switch (SW) 354 connected to the plurality of X electrodes X0 to Xm, and a switch 355 connected to the plurality of Y electrodes Y0 to Yn. The switch 354 is configured to connect some of the X electrodes to the touch panel driver 351 and the remaining X electrodes to the X electrode driver 352, or vice versa. The switch 355 is configured such that some of the Y electrodes are connected to the touch panel driver 351 and other Y electrodes are connected to the Y electrode driver 353, or vice versa.

The tactile sense presentation touch panel controller 350 includes a main controller 356. The main controller 356 is connected to the touch panel driver 351, the X electrode driver 352, the Y electrode driver 353, the switch 354, and the switch 355. The main controller 356 receives a control signal from outside of the tactile sense presentation touch panel controller 350, and controls the respective components in the tactile sense presentation touch panel controller 350.

The touch sense presentation touch panel device 15 presents a texture feeling on the touch surface 105 through the operations of the X electrode driver 352 and the Y electrode driver 353. When a user touches the touch surface 105 by a finger, the finger is equivalent to an electrode that faces the X electrode or the Y electrode across an insulator and that is connected to the ground. When a voltage is applied to the X electrode and the Y electrode, an electrostatic attractive force (electrostatic force) is generated between the X electrode or the Y electrode and the finger.

When an AC voltage is applied, the electrostatic force periodically changes. With this change of the electrostatic force, the frictional force between the touch surface 105 and the finger periodically changes. When the user traces the touch surface 105 with a finger, the frictional force felt by the finger periodically changes, and the user perceives the texture feeling. When the frequency of the AC voltage is greater than 5 Hz and less than 500 Hz, a tactile sense is perceived, and when the frequency is not within this range, a tactile sense is not perceived.

When an AC voltage of the first frequency f1 is applied to the X electrode and an AC voltage of the second frequency f2 is applied to the Y electrode, the electrostatic force changes at the first frequency f1 and the second frequency f2. Furthermore, a beat where the electrostatic force changes at the frequency of the difference between the first frequency f1 and the second frequency f2 occurs. When the frequency of the beat is greater than 10 Hz and less than 1000 Hz, the texture feeling due to the beat is perceived, and when the beat frequency is not within this range, the texture feeling due to the beat is not perceived.

In one example, the first frequency f1 and the second frequency f2 are set such that both are at least 500 Hz, and such that the absolute value of the difference between the first frequency f1 and the second frequency f2 is greater than 10 Hz and less than 1000 Hz. For example, the first frequency f1 is 1000 Hz and the second frequency f2 is 1240 Hz.

The main controller 356 controls the X electrode driver 352 to apply the first AC voltage to some of the X electrodes connected to the X electrode driver 352 and connect the other X electrodes to the ground. The main controller 356 controls the Y electrode driver 353 to apply the second AC voltage to some of the Y electrodes connected to the Y electrode driver 353 and connect the other Y electrodes to the ground.

For example, when the touch panel 100 includes five X electrodes X0 to X4 and six Y electrodes Y0 to Y5, the first AC voltage is applied to the X electrode X1, the second AC voltage is applied to the Y electrode Y1, and the X electrodes X0, X2 to X4 and the Y electrodes Y0 and Y2 to Y5 are connected to the ground. At this time, a beat of 240 Hz occurs at the intersection of the X electrode X1 and the Y electrode Y1 on the touch surface 105, and the user can perceive the texture feeling with the finger. At the respective intersections of the X electrode X1 and the Y electrodes Y0 and Y2 to Y5, the electrostatic force changes at 1000 Hz, but the texture feeling is not perceived.

At the respective intersections of the Y electrode Y1 and the X electrodes X0 and X2 to X4, the electrostatic force changes at 1240 Hz, but the texture feeling is not perceived. In the other locations, the electrostatic force does not change, and therefore, the texture feeling is not perceived. In this manner, the tactile sense presentation touch panel device 15 can present a texture feeling to a desired position on the touch surface 105. The X electrode driver 352 and the Y electrode driver 353 may connect the X electrodes and the Y electrodes to a predetermined DC power supply, instead of the ground.

The touch panel driver 351 sequentially selects the X electrodes X0 to Xm and the Y electrodes Y0 to Yn, applies a drive signal (AC voltage signal) to the selected detection electrode, and further measures a current signal of the detection electrode. The touch panel driver 351 detects an alternating current according to the self-capacitance (parasitic capacitance) of the detection electrode. When a user's finger touches a portion of the touch surface 105 facing the detection electrode, the self-capacitance of the detection electrode changes (increases), which causes a change (increase) in the signal current (alternating current) of the detection electrode.

The main controller 356 gives a driving signal to the touch panel driver 351 and designates a detection electrode to be measured for a signal current. The main controller 356 compares the signal current measured by the touch panel driver 351 with a predetermined threshold value to detect an increase in the self-capacitance of the detection electrode connected to the touch panel driver 351.

When the electrostatic capacity increases, the main controller 356 specifies the detection electrode connected to the touch panel driver 351, thereby specifying the position where the user's finger is touching. That is, the main controller 356 identifies the position where the user's finger is touching by specifying the X electrode and the Y electrode whose electrostatic capacitance has changed. The touch position is a position on the touch surface 105 that faces the intersection of the X electrode and the Y electrode whose electrostatic capacitance has changed. In this way, the tactile sense presentation touch panel device detects the touch position on the touch surface by the self-capacitance method. The main controller 356 may apply the driving signal to the plurality of detection electrodes at the same time and measure the current signal.

Next, a process for achieving both the detection of a touch point and the presentation of a texture feeling by the tactile sense presentation touch panel device 15 will be described. The main controller 356 controls the switch 354 that connects each X electrode to one of the touch panel driver 351 and the X electrode driver 352. The main controller 356 controls the switch 355 that connects each Y electrode to one of the touch panel driver 351 and the Y electrode driver 353.

The main controller 356 causes the switch 354 to sequentially change the X electrode to be connected to the touch panel driver 351. When changing the X electrode connected to the touch panel driver 351, the switch 354 connects the X electrode, which has been connected to the touch panel driver 351, to the X electrode driver 352, and connects some of the plurality of X electrodes, which have been connected to the X electrode driver 352, to the touch panel driver 351.

For example, the switch 354 changes the state in which, among the X electrodes X0 to Xm, the X electrode X0 is connected to the touch panel driver 351 and the X electrodes X1 to Xm are connected to the X electrode driver 352 to the state in which the X electrode X1 is connected to the touch panel driver 351 and the X electrodes X0 and X2 to Xm are connected to the X electrode driver 352. Similarly, the X electrode to be connected to the touch panel driver 351 is sequentially changed.

The main controller 356 causes the switch 355 to sequentially change the Y electrode to be connected to the touch panel driver 351. When changing the Y electrode connected to the touch panel driver 351, the switch 355 connects the Y electrode, which has been connected to the touch panel driver 351, to the Y electrode driver 353, and connects some of the plurality of Y electrodes, which have been connected to the Y electrode driver 353, to the touch panel driver 351.

For example, the switch 354 changes the state in which, among the Y electrodes Y0 to Yn, the Y electrode Y0 is connected to the touch panel driver 351 and the Y electrodes Y1 to Yn are connected to the Y electrode driver 353 to the state in which the Y electrode Y1 is connected to the touch panel driver 351 and the Y electrodes Y0 and Y2 to Yn are connected to the Y electrode driver 353. Similarly, the Y electrode to be connected to the touch panel driver 351 is sequentially changed.

The main controller 356 controls the X electrode driver 352 to apply the first AC voltage to the X electrodes corresponding to the area where the texture feeling should be presented, and connects the other X electrodes to the ground. The main controller 356 controls the Y electrode driver 353 to apply the second AC voltage to the Y electrodes corresponding to the area where the texture feeling should be presented, and connects the other Y electrodes to the ground.

The main controller 356 sequentially connects the X electrode and the Y electrode to the touch panel driver 351, and sequentially controls the X electrode and the Y electrode to detect a touch on the touch surface 105. The touch surface 105 is scanned to detect the touch point. After the scanning of the entire touch surface 105 is completed, the main controller 356 connects the next X electrode and Y electrode to the touch panel driver 351, and repeats this process. The scanning is repeated, and when the user touches any point on the touch surface 105, the touch position is detected.

When the respective electrodes are not connected to the touch panel driver 351, the first AC voltage is applied to one or a plurality of X electrodes adjacent to each other, and the second AC voltage is applied to one or a plurality of Y electrodes adjacent to each other. The other X and Y electrodes are connected to the ground. As a result, a texture feeling is presented to a specific target area in the touch surface 105.

By controlling the X electrodes and the Y electrodes as described above, a part of the touch surface 105 is used for touch detection, another part is used for presenting a texture feeling, and the part used for touch detection is sequentially changed. Each part on the touch surface 105 is used for touch detection at a specific timing, and is used for presenting a texture feeling in other periods.

Figure 3:
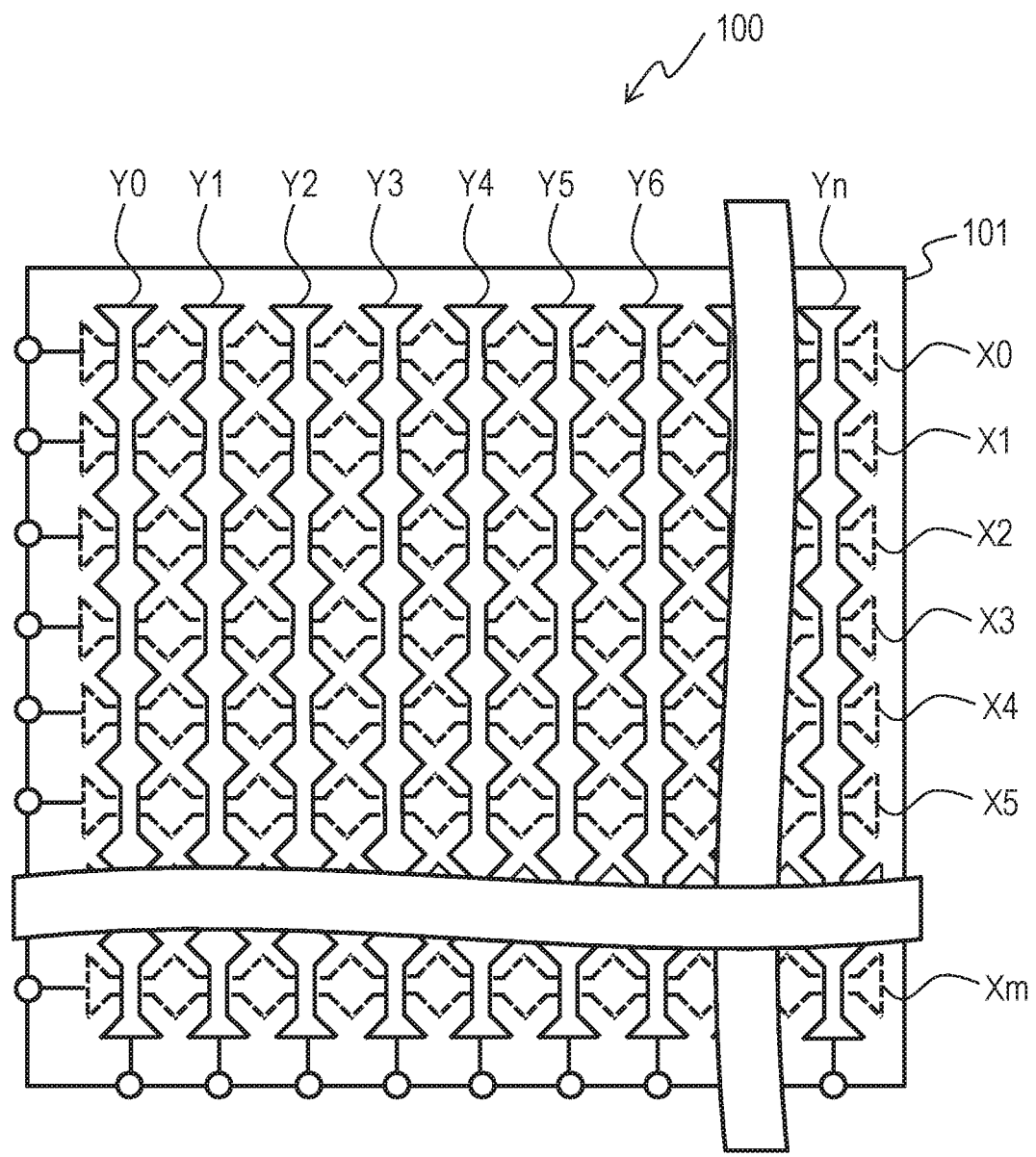
FIG. 3 is a schematic diagram illustrating the tactile sense presentation touch panel.

FIG. 3 is a schematic diagram illustrating the tactile sense presentation touch panel 100. The tactile sense presentation touch panel 100 includes a supporting substrate 101 and a plurality of X electrodes X0 to Xm and a plurality of Y electrodes Y0 to Yn. The supporting substrate 101 is an insulating substrate, and is typically formed of a transparent insulating material such as resin or glass. The supporting substrate 101 may be a flexible substrate or an inflexible substrate.

The number of the X electrodes and the number of the Y electrodes depend on the design of the touch panel 100. The X electrodes and the Y electrodes are typically formed of a transparent conductor such as ITO or IZO, for example.

The plurality of X electrodes X0 to Xm extend in parallel with one side of the rectangular supporting substrate 101, and are arranged in parallel with each other with a gap therebetween. The plurality of Y electrodes Y0 to Yn extend in parallel with another side of the supporting substrate 101, and are arranged in parallel with each other with a gap therebetween. The plurality of X electrodes X0 to Xm and the plurality of Y electrodes Y0 to Yn intersect with each other. The Y electrodes Y0 to Yn are insulated from the X electrodes X0 to Xm via an insulating film at the respective intersections.

In the example of FIG. 3, the X electrodes X0 to Xm extend in the left and right direction of the figure. The Y electrodes Y0 to Yn extend in the up and down direction of the figure. Each of the X electrodes and each of the Y electrodes are perpendicular to each other. The X electrodes X0 to Xm neither have to be parallel to each other, nor parallel to one side of the supporting substrate 101. The Y electrodes Y0 to Yn neither have to be parallel to each other, nor parallel to one side of the supporting substrate 101. Each of the X electrodes and each of the Y electrodes do not have to be perpendicular to each other.

In the example of FIG. 3, the X electrodes X0 to Xm has a shape in which a plurality of diamonds are connected with each other via connectors, respectively. That is, one X electrode is formed by electrically connecting diamonds adjacent to each other in the horizontal direction via connectors, and extends in the horizontal direction. Similarly, the Y electrodes Y0 to Yn has a shape in which a plurality of diamonds are connected with each other via connectors, respectively. One Y electrode is formed by electrically connecting diamonds adjacent to each other vertically via connectors, and extends in the vertical direction. In the example of FIG. 3, the respective ends of each X electrode and Y electrode are in a triangle shape.

The X electrodes X0 to Xm and the Y electrodes Y0 to Yn are formed such that when viewed from the perpendicular direction relative to the main surface of the supporting substrate 101 (in a plan view), the connectors of the diamonds overlap with each other via an insulating film. The diamonds of the X electrodes X0 to Xm and the diamonds of the Y electrodes Y0 to Yn do not overlap with each other. In other words, the diamonds of the X electrodes X0 to Xm and the diamonds of the Y electrodes Y0 to Yn are formed in the same surface.

Each diamond of an X electrode is present between the two Y electrodes adjacent to each other, and the pitch of the diamonds of each X electrodes coincides with the pitch of the Y electrodes Y0 to Yn. Each diamond of a Y electrode is present between the two X electrodes adjacent to each other, and the pitch of the diamonds of each Y electrodes coincides with the pitch of the X electrodes X0 to Xm.

The shape of the supporting substrate 101 is determined by design, and does not necessarily have to be a rectangular shape, and may be a polygonal with five vertices or more, or may have a curved side. The shapes of the X electrodes and Y electrodes are determined by design. In the example of FIG. 3, the shape thereof may be a band shape (rectangular shape), for example, and a plurality of prescribed wider portions of a prescribed shape (diamond shape in the example of FIG. 3) are connected to each other with narrower connectors.

Figure 4:
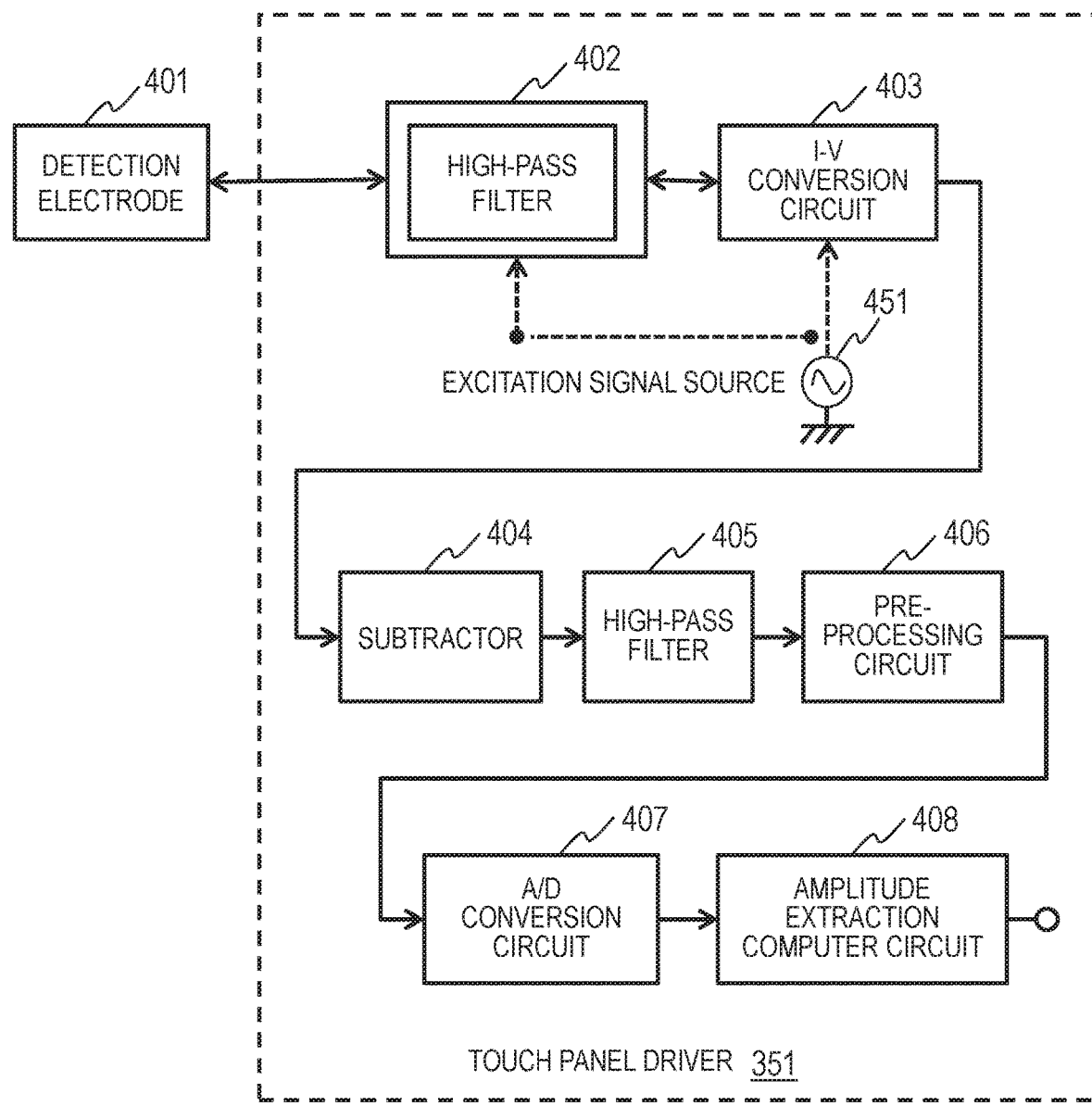
FIG. 4 illustrates an example of a part of the logical configuration of the touch panel driver.

One of the features of the present disclosure is the touch panel driver 351. Below, the configuration and operation of the touch panel driver 351 will be explained. FIG. 4 illustrates an example of a part of the logical configuration of the touch panel driver 351. The touch panel driver 351 includes a high-pass filter 402, a current-voltage conversion circuit (I-V conversion circuit) 403, a subtractor 404, a high-pass filter 405, a pre-processing circuit 406, an A/D conversion circuit 407, and an amplitude extraction computer circuit 408.

The high-pass filter 402 receives a current signal from the detection electrode 401. The I-V conversion circuit 403 receives an output from the high-pass filter 402. The high-pass filter 402 is one of the features of the present disclosure, and the configuration and operation thereof will be explained in detail later.

An excitation signal to be applied to the detection electrode 401 for measuring the self-capacitance is given from an excitation signal source 451 to the high-pass filter 402 and the I-V conversion circuit 403. As described later, the high-pass filter 402 uses an excitation signal for touch detection as a reference potential. The I-V conversion circuit 403 gives the excitation signal from the excitation signal source 451 to the detection electrode 401.

The subtractor 404 receives the voltage signal output from the I-V conversion circuit 403, and subtracts the excitation signal from the output voltage signal. The high-pass filter 405 is a general filter, and removes noise of the output signal from the subtractor 404. The pre-processing circuit 406 includes a gain/offset adjustment circuit and an anti-alias filter circuit.

The A/D conversion circuit 407 converts the analog signal from the pre-processing circuit 406 into a digital signal of a prescribed bit number such as 14 bits. The amplitude extraction computer circuit 408 calculates and outputs the average amplitude for a certain period (specifically, 450 μs per detection electrode) based on the signal value for that period. The main controller 356 compares the amplitude indicated by the output of the amplitude extraction computer circuit 408 with a threshold value to determine the presence or absence of a touch in the vicinity of the detection electrode 401.

Figure 5:
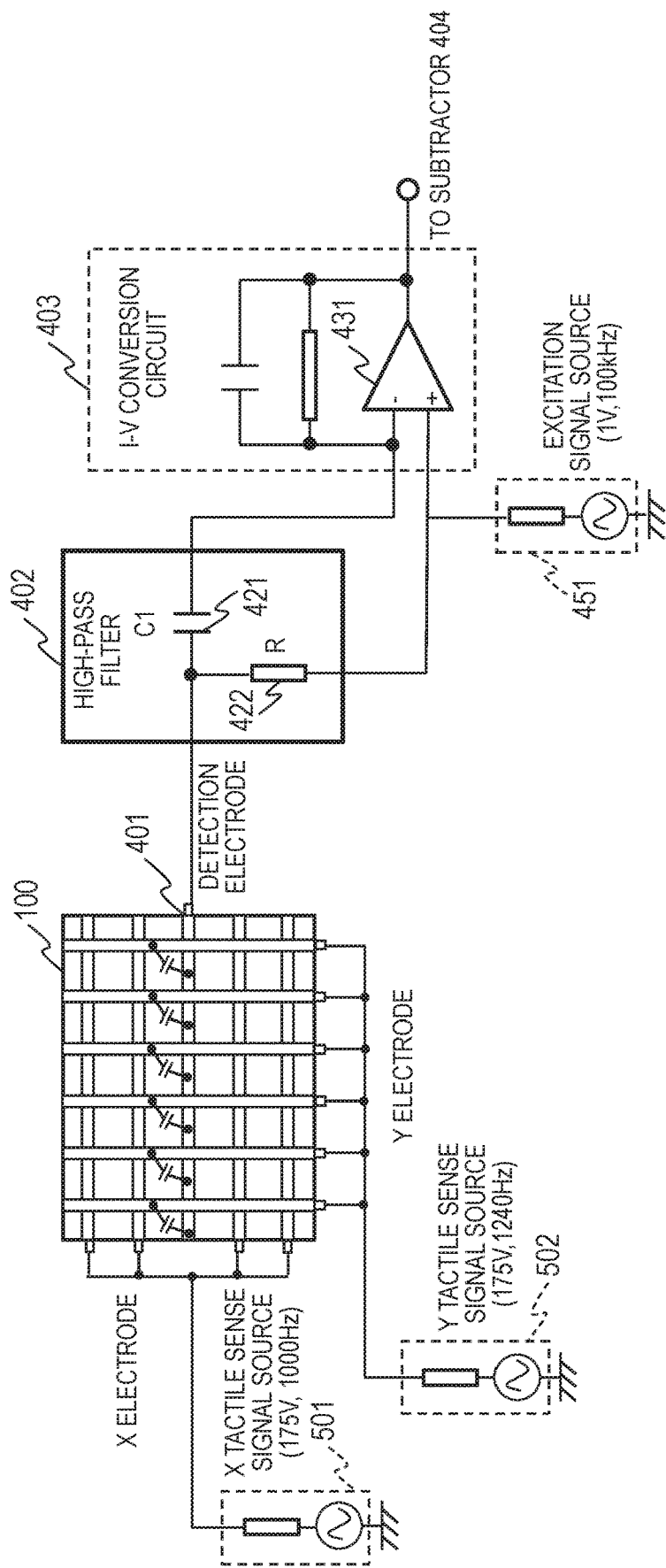
FIG. 5 schematically illustrates the partial configuration of the tactile sense presentation touch panel device, related to the measurement of the current signal of the detection electrode.

FIG. 5 schematically illustrates the partial configuration of the tactile sense presentation touch panel device 15, related to the measurement of the current signal of the detection electrode 401. FIG. 5 illustrates the tactile sense presentation touch panel 100 in a simplified form. In FIG. 5, one X electrode is selected as the detection electrode 401. In FIG. 5, a driving signal (tactile sense signal) for the tactile sense presentation is given to all the X electrodes and Y electrodes except for the detection electrode 401. However, the tactile sense signal may alternatively be applied to selected X electrodes and selected Y electrodes only, among all of the X electrodes and Y electrodes.

For touch detection, the touch panel driver 351 drives the selected detection electrode 401 with the excitation signal from the excitation signal source 451, and measures the amplitude of the current signal flowing through the detection electrode 401. As described above, the tactile sense presentation touch panel device 15 of the present disclosure performs texture feeling presentation as well as touch detection.

In the example of FIG. 5, an X tactile sense signal from an X tactile sense signal source 501 is applied to the X electrode. The X tactile sense signal has an amplitude of 175V and a frequency of 1000 Hz, for example. A Y tactile sense signal from a Y tactile sense signal source 502 is applied to the Y electrode. The Y tactile sense signal has an amplitude of 175V and a frequency of 1240 Hz, for example.

With the frequency difference of 240 Hz, an appropriate texture feeling can be given to the finger.

The tactile sense presentation touch panel controller 350 gives a driving signal for tactile presentation to other electrodes while measuring the current signal at the detection electrode 401. When driving the detection electrode 401 for detecting the touch position and driving other electrodes for tactile sense presentation at the same time as described above, due to the capacitance coupling between the detection electrode 401 and the other electrodes, the current of the tactile sense signal component is superimposed on the current signal from the detection electrode 401 as noise.

In the example of FIG. 5, there is a coupling capacitance between the detection electrode 401 and each of the Y electrodes intersecting with the detection electrode 401. Although not illustrated in the figure, there is also a coupling capacitance between the detection electrode 401 and the X electrodes adjacent to the detection electrode 401. Therefore, when a tactile sense signal is given to the Y electrodes intersecting with the detection electrode 401 and the X electrodes adjacent to the detection electrode 401, an unnecessary current flows to the detection electrode 401 via these coupling capacitances. This current is superimposed on the current signal from the detection electrode 401 as noise, which lowers the SNR of the current signal from the detection electrode 401. In addition, power supply noise derived from a commercial power source or the like also flows to the detection electrode 401, and may cause adverse effects on the current signal from the detection electrode 401 when being superimposed thereon The touch panel driver 351 of the present disclosure includes a high-pass filter 402 inserted between the detection electrode 401 and the I-V conversion circuit 403. The high-pass filter 402 can effectively remove the noise component superimposed on the current signal from the detection electrode 401.

In the example of FIG. 5, the high-pass filter 402 is constituted of a capacitance element (capacitor) 421 and a resistance element 422 (CR high-pass filter). The capacitance value of the capacitance element 421 is C1, and the resistance value of the resistance element 422 is R. The capacitance element 421 is connected in series to the detection electrode 401 and the I-V conversion circuit 403 between the detection electrode 401 and the I-V conversion circuit 403.

The resistance element 422 is connected in series with a node between the detection electrode 401 and the capacitance element 421 and the excitation signal source 451 between the node and the excitation signal source 451. That is, the reference potential node of the high-pass filter 402 is connected to the excitation signal source 451, instead of the ground. The excitation signal from the excitation signal source 451 is the reference potential of the high-pass filter 402. The excitation signal source 451 is a voltage source, and outputs an AC voltage having an amplitude of 1V and a frequency of 100 kHz, for example.

In the example of FIG. 5, the I-V conversion circuit 403 is a current-voltage conversion circuit that uses the operational amplifier 431. A resistance element and a capacitance element are connected in parallel between the inverting input and the output of the operational amplifier 431. The excitation signal source 451 is connected to the non-inverting input of the operational amplifier 431. The capacitance element 421 of the high-pass filter 402 is connected between the inverting input of the operational amplifier 431 and the detection electrode 401.

The voltage at the non-inverting input is the output voltage (excitation signal) of the excitation signal source 451. Due to the imaginary short, the voltage of the inverting input of the operational amplifier 431 coincides with the voltage signal of the excitation signal source 451. The detection electrode 401 is connected to the inverting input of the operational amplifier 431 via the high-pass filter 402, and the excitation signal from the excitation signal source 451 is given to the detection electrode 401 via the high-pass filter 402.

FIG. 5 merely illustrates an example of the circuit configuration of the I-V conversion circuit 403, and the I-V conversion circuit 403 may have any circuit configuration. For example, the touch panel driver 351 may be configured such that each electrode of the plurality of X electrodes and the plurality of Y electrodes includes a drive detection circuit that includes a high-pass filter, an excitation signal source, and an I-V conversion circuit, and such that an electrode to be connected to one drive detection circuit is changed by a switch. One excitation signal source may be shared by a plurality of pairs of a high-pass filter and an I-V conversion circuit.

Figure 6:
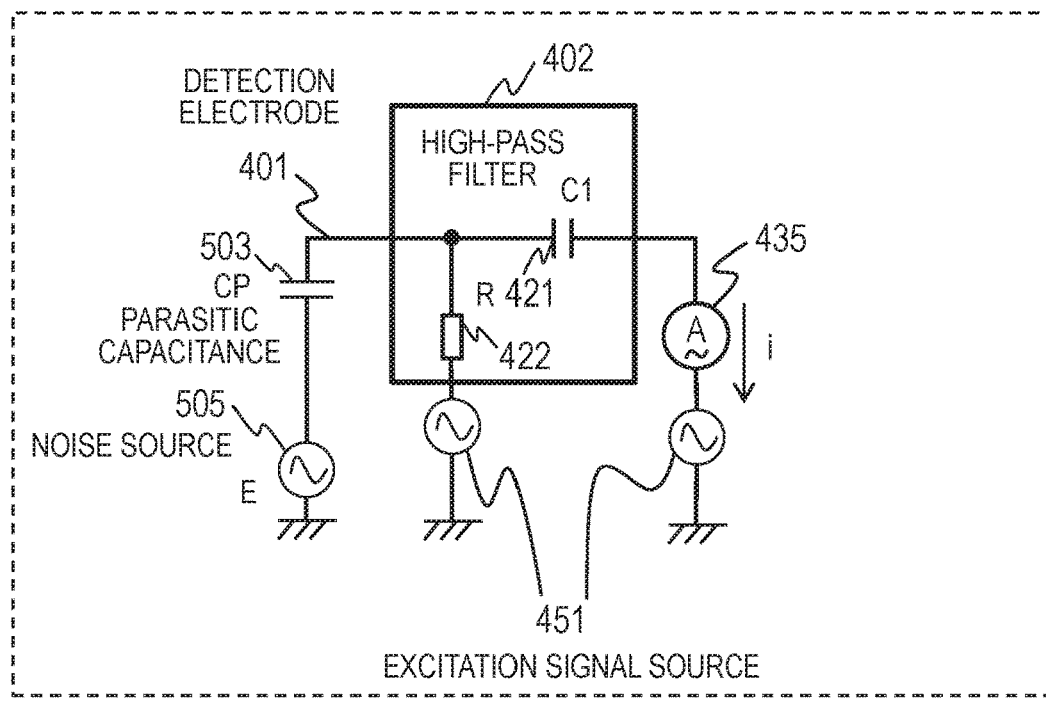
FIG. 6 illustrates an equivalent circuit of the configuration of FIG. 5.
Figure 7:
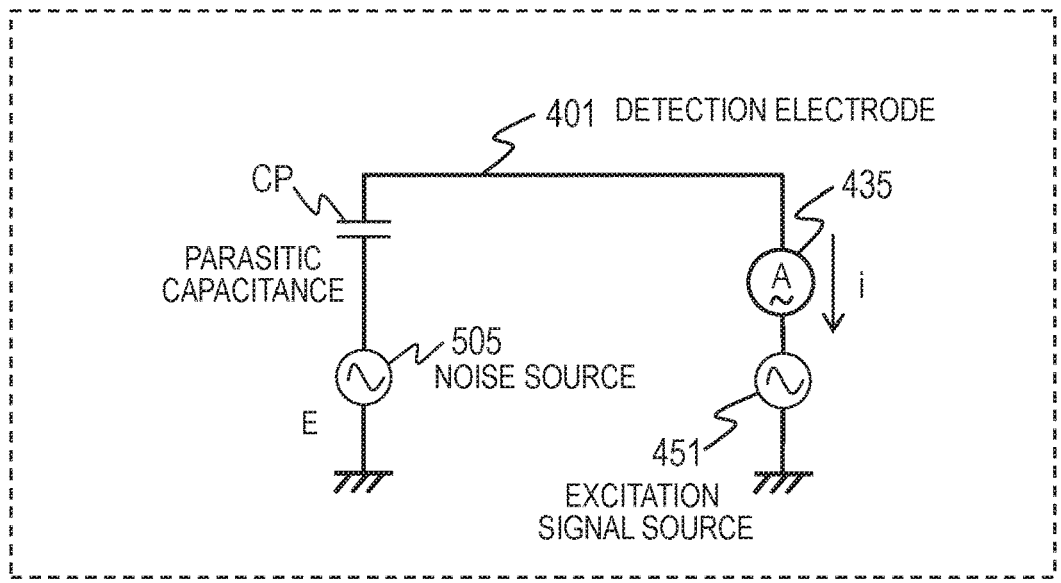
FIG. 7 illustrates an equivalent circuit of the configuration of FIG. 5 except that the high-pass filter is omitted (Comparison Example 1).

FIG. 6 illustrates an equivalent circuit of the configuration of FIG. 5. FIG. 7 illustrates an equivalent circuit of the configuration of FIG. 5 except that the high-pass filter 402 is omitted (Comparison Example 1). As illustrated in FIG. 6, the detection electrode 401 receives noise from a noise source 505 via parasitic capacitance 503. The capacitance value of the parasitic capacitance 503 is represented by CP. The parasitic capacitance 503 includes coupling capacitance between the detection electrode 401 and surrounding electrodes. The signal of the noise source 505 includes a tactile sense signal provided to the X electrode and the Y electrode. In this example, the signal from the noise source 505 is an AC voltage with the amplitude E.

In the circuit of FIG. 6, the I-V conversion circuit 403 is replaced with a current detection circuit 435 that measures the signal current i. As described above, the I-V conversion circuit 403 may have any circuit configuration as long as it can measure the signal current of the detection electrode 401. As illustrated in FIG. 6, the excitation signal from the excitation signal source 451 is used as not only a signal to drive the detection electrode 401, but also the reference potential of the high-pass filter 402.

Figure 8:
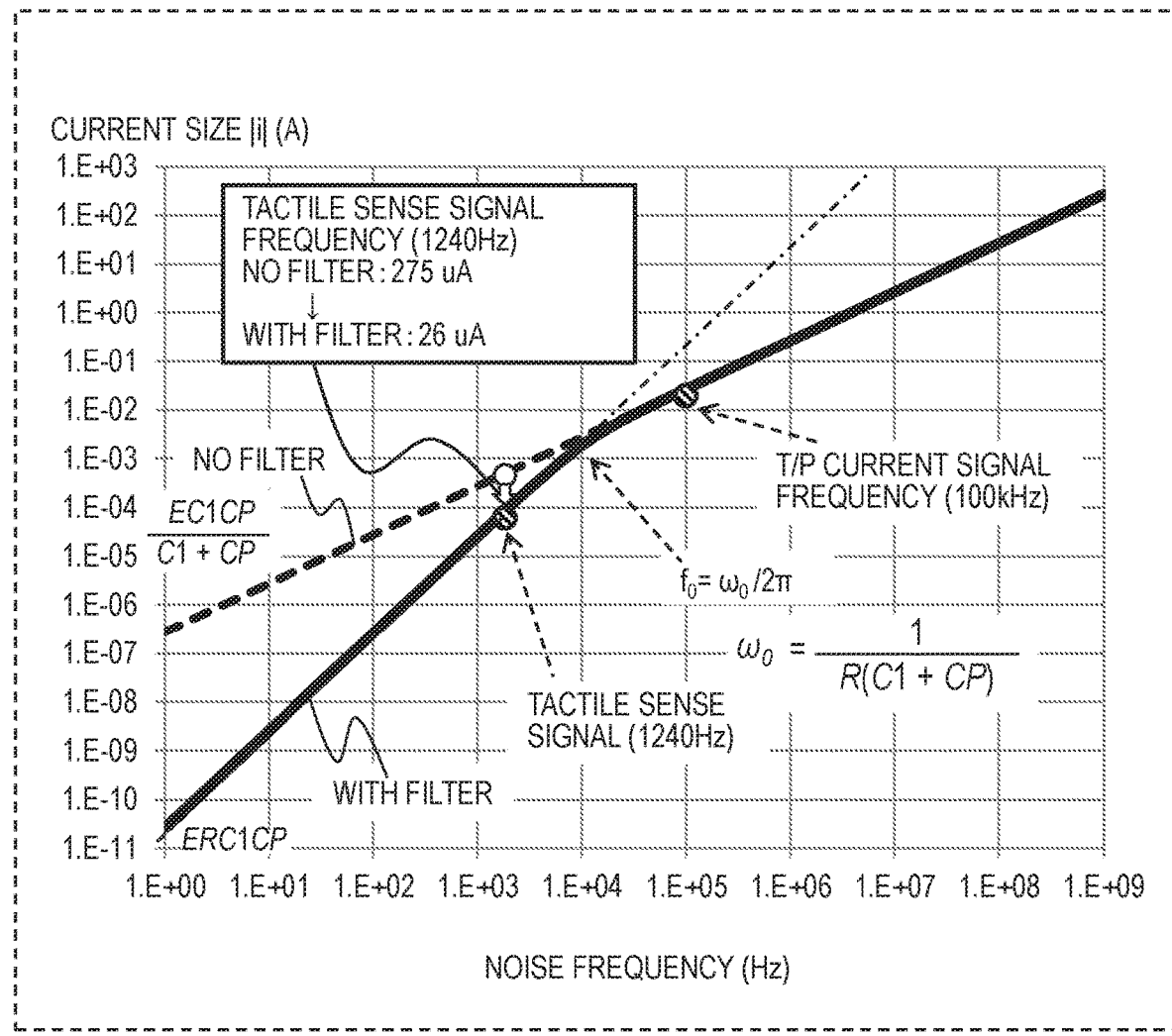
FIG. 8 is a graph illustrating the analysis result of the relationship between the noise signal and the noise current of the noise source in the equivalent circuit of FIGS. 6 and 7.

FIG. 8 is a graph illustrating the analysis result of the relationship between the noise signal and the noise current of the noise source 505 in the equivalent circuit of FIGS. 6 and 7. The horizontal axis of the graph of FIG. 8 is the frequency of the noise source 505, and the vertical axis is the size of the noise current measured by the current detection circuit 435. The relationship indicated in FIG. 8 represents the relationship between the frequency of the noise source 505 and the measured current by the current detection circuit 435 in a circuit in which the respective excitation signal sources 451 of the equivalent circuit of FIGS. 6 and 7 are short-circuited.

In the graph of FIG. 8, the solid line indicates the relationship between the noise frequency and the noise current in the circuit of FIG. 6 including the high-pass filter 402. The broken line indicates the relationship between the noise frequency and the noise current in the circuit of FIG. 7 not including the high-pass filter 402. In the analysis, the noise from the noise source 505 is assumed to be an AC signal of 175V.

As illustrated in FIG. 8, the circuit including the high-pass filter 402 significantly reduces the noise current at a frequency lower than a prescribed frequency f0. The frequency f0 is determined by the capacitance value CP of the parasitic capacitance, the capacitance value C1 of the capacitance element 421 of the high-pass filter 402, and the resistance value R of the resistance element 422 of the high-pass filter 402, which specifically is ½πR (C1+CP).

The noise current (solid line) indicated in FIG. 8 can be approximated by a line that smoothly connects, with the point of frequency f0, a straight line (broken straight line) in which the intercept is EC1CP/(C1+CP) and the gradient is 20 dB/decade (the current increases by 10 times each time the frequency becomes 10 times) and a straight line (dashed straight line) in which the intercept is ERC1CP and the gradient is 40 dB/decade. A straight line with the intercept being EC1CP/(C1+CP) coincides with the broken line indicating the relationship between the noise frequency and the noise current in the circuit not including the high-pass filter 402.

In designing the high-pass filter 402, the capacitance value C1 and the resistance value R are determined such that the frequency f0 falls between the frequency (such as 100 kHz) of the excitation signal source 451 and the higher frequency (such as 1240 Hz) of the tactile sense signal, which is the main noise. FIG. 8 illustrates an example in which the capacitance value C1 and the resistance value R are determined in this way.

In this manner, the high-pass filter 402 can greatly lower the tactile sense signal component in the current signal of the detection electrode 401 with respect to the current signal for touch detection. In the example of FIG. 8, the noise of 1240 Hz is greatly lowered from 275 µA to 26 µA by the high-pass filter 402.

Below, a plurality of comparison examples of the high-pass filter 402 will be explained. The high-pass filters of the comparison examples described below cannot show the desired attenuation characteristic of the noise component included in the current signal at the detection electrode, unlike the high-pass filter 402 of the present disclosure.

Figure 9:
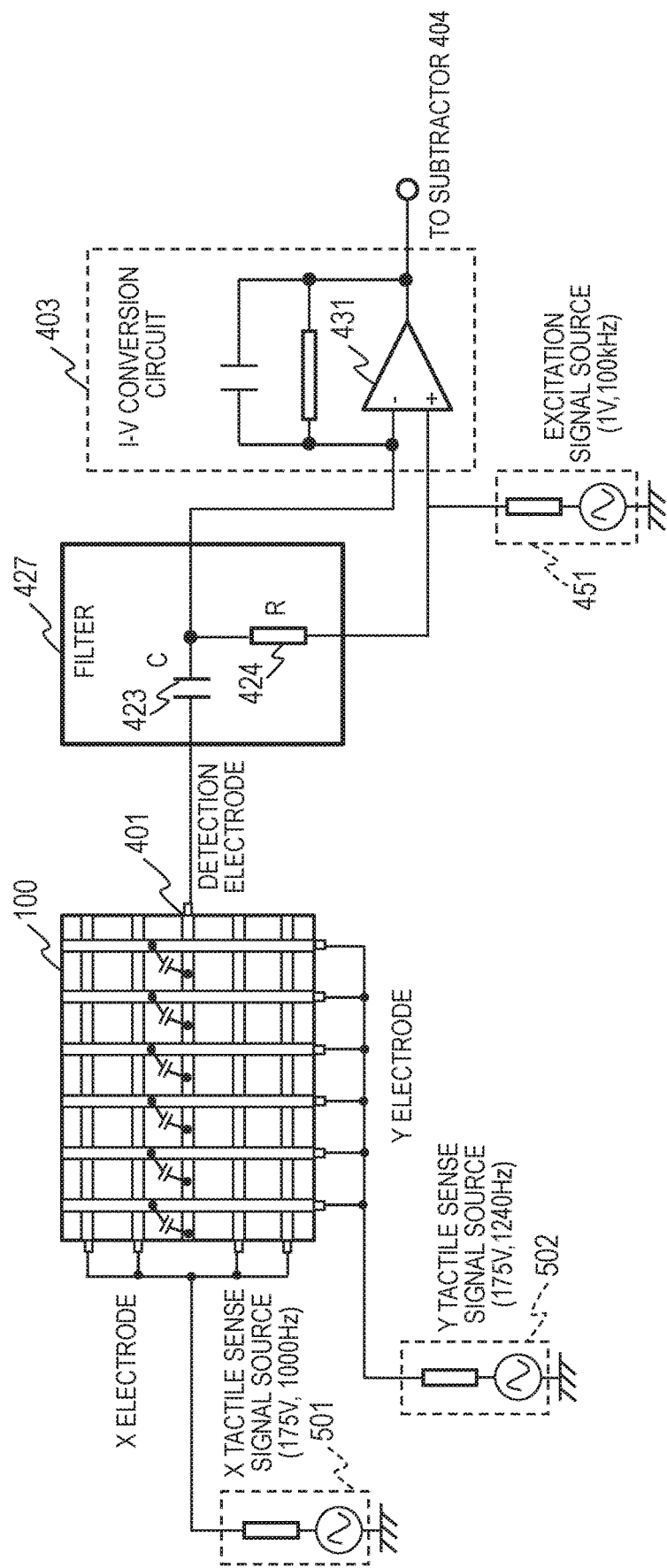
FIG. 9 illustrates a circuit configuration of Comparison Example 2.

FIG. 9 illustrates a circuit configuration of Comparison Example 2. Comparison Example 2 differs from the circuit of the present disclosure illustrate in FIG. 5 in that the high-pass filter 402 is replaced with a filter 427. The other configurations are the same. The filter 427 includes a capacitance element 423 and a resistance element 424. The connection node of the resistance element 424 differs from that of the high-pass filter 402 of the present disclosure.

Specifically, the resistance element 424 of the high-pass filter 402 of the present disclosure is connected between the excitation signal source 451 and the node between the detection electrode 401 and the capacitance element 421. On the other hand, the resistance element 424 of Comparison Example 2 is connected between the excitation signal source 451 and the node between the capacitance element 423 and the I-V conversion circuit 403.

Figure 10:
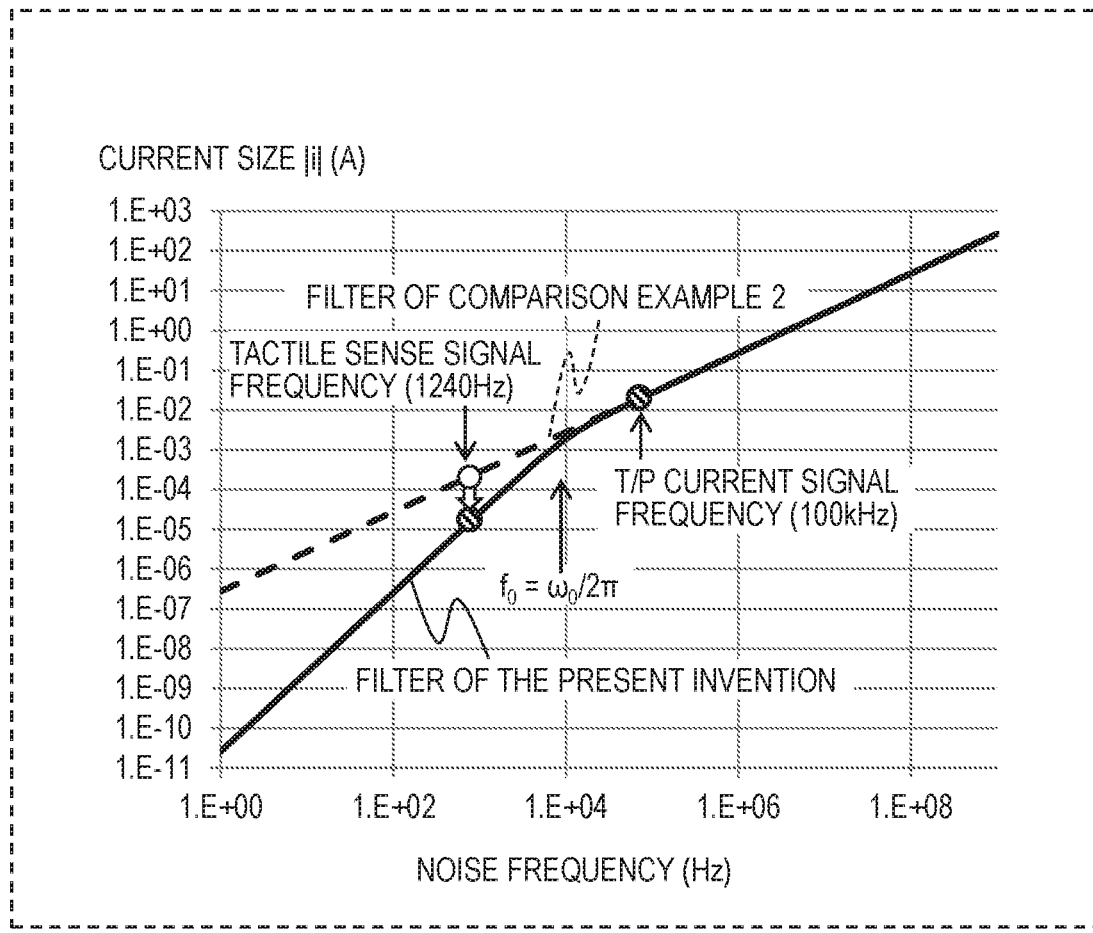
FIG. 10 is a graph comparing the characteristics of the filter of Comparison Example 2 and the high-pass filter of the present disclosure shown in FIG. 5.

FIG. 10 is a graph comparing the characteristics of the filter 427 of Comparison Example 2 and the high-pass filter 402 of the present disclosure shown in FIG. 5. FIG. 10 is a graph illustrating the analysis result of the relationship between the noise signal and the noise current of the noise source 505 in a manner similar to FIG. 8. The horizontal axis is the frequency of the noise source 505, and the vertical axis is the size of the noise current measured by the current detection circuit 435.

In FIG. 10, the solid line indicates the characteristics of the high-pass filter 402 of the present disclosure, and the broken line indicates the characteristics of the filter 427 of Comparison Example 2. As illustrated in FIG. 10, the filter 427 of Comparison Example 2 does not largely attenuate the frequency component of the tactile sense signal in a range lower than the excitation signal for touch detection.

Figure 11:
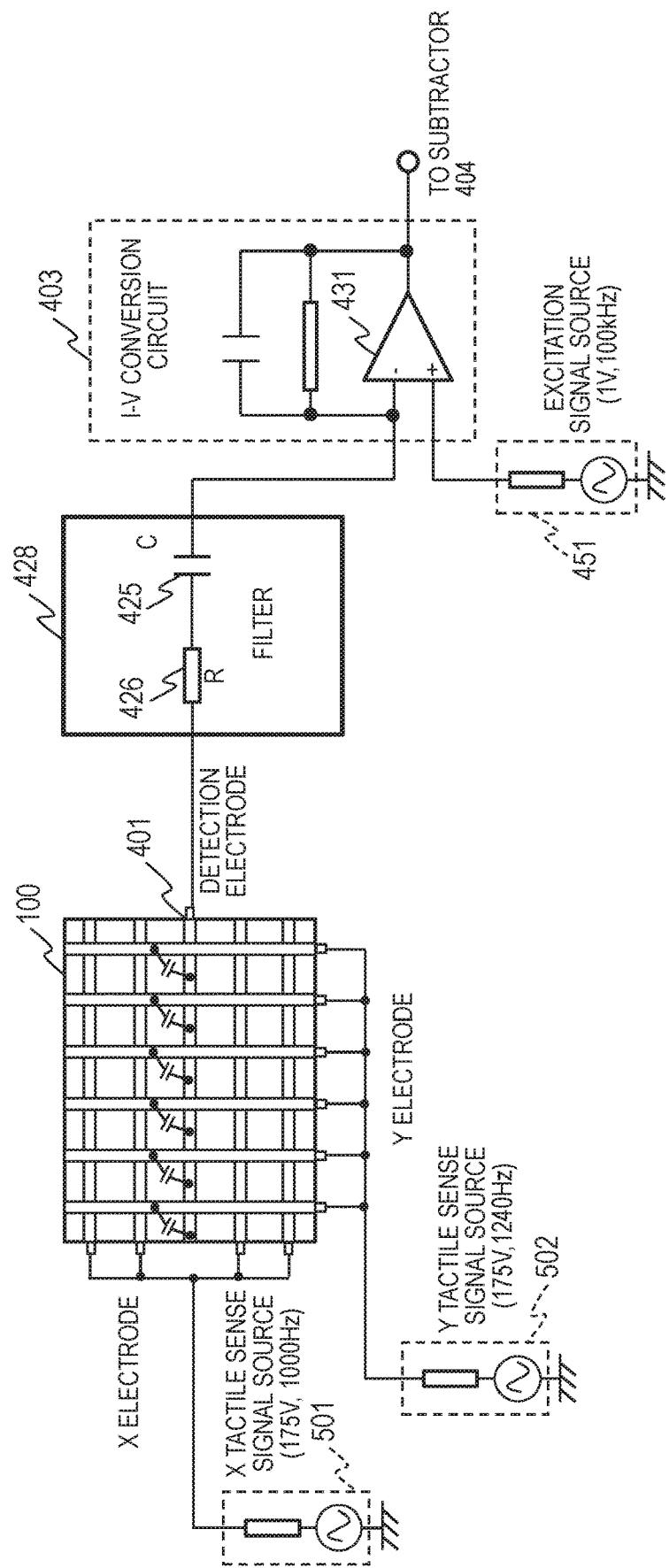
FIG. 11 illustrates a circuit configuration of Comparison Example 3.

Next, a high-pass filter of another comparison example will be explained. FIG. 11 illustrates a circuit configuration of Comparison Example 3. Comparison Example 3 differs from the circuit of the present disclosure illustrate in FIG. 5 in that the high-pass filter 402 is replaced with a filter 428. The other configurations are the same. The filter 428 includes a capacitance element 425 and a resistance element 426.

The connection configuration between the capacitance element 425 and the resistance element 426 differs from that of the high-pass filter 402 of the present disclosure. Specifically, in the filter 428 of Comparison Example 3, the capacitance element 425 and the resistance element 426 are connected in series between the detection electrode 401 and the I-V conversion circuit 403.

Figure 12:
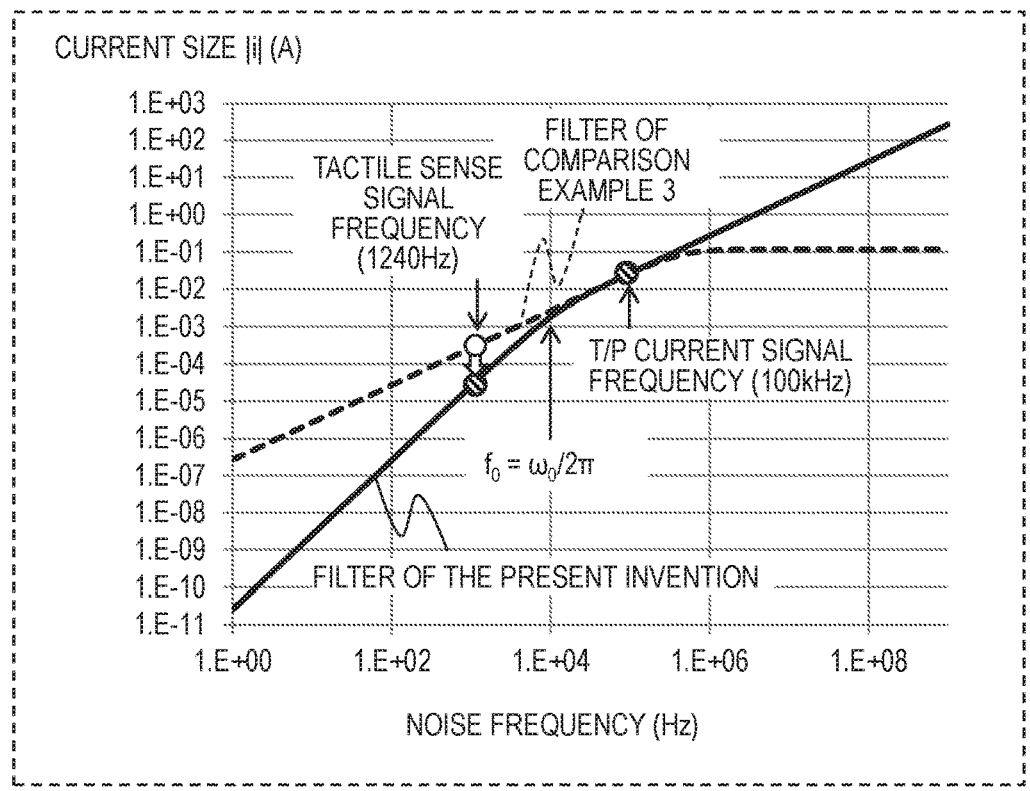
FIG. 12 is a graph comparing the characteristics of the filter of Comparison Example 3 and the high-pass filter of the present disclosure shown in FIG. 5.

FIG. 12 is a graph comparing the characteristics of the filter 428 of Comparison Example 3 and the high-pass filter 402 of the present disclosure shown in FIG. 5. FIG. 12 is a graph illustrating the analysis result of the relationship between the noise signal and the noise current of the noise source 505 in a manner similar to FIG. 8. The horizontal axis is the frequency of the noise source 505, and the vertical axis is the size of the noise current measured by the current detection circuit 435.

In FIG. 12, the solid line indicates the characteristics of the high-pass filter 402 of the present disclosure, and the broken line indicates the characteristics of the filter 428 of Comparison Example 3. As illustrated in FIG. 12, the filter 428 of Comparison Example 3 does not largely attenuate the frequency component of the tactile sense signal in a range lower than the excitation signal for touch detection.

As described with reference to Comparison Examples 2 and 3, in order to reduce the noise of the current signal in the detection electrode 401 with the CR high-pass filter, the connection relation between the resistance element and the capacitance element is important. The high-pass filter 402 of the present disclosure, which has the configuration described above, can effectively reduce the noise of the current signal in the detection electrode 401.

Figure 13:
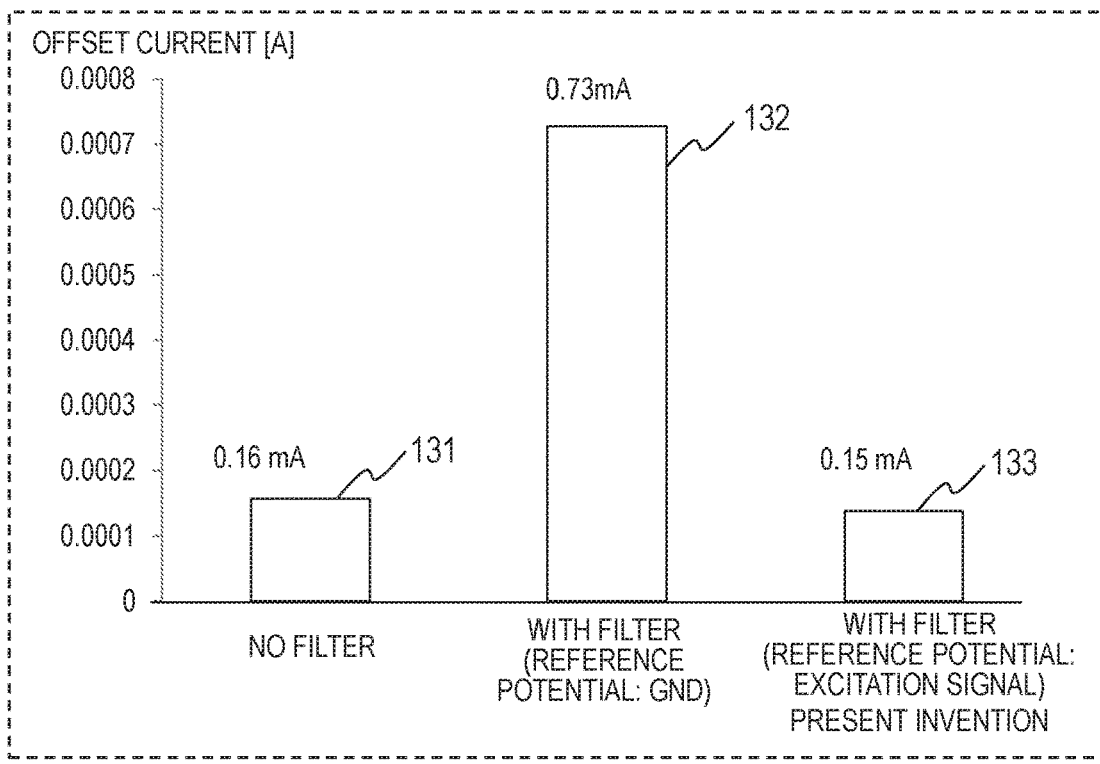
FIG. 13 illustrates simulation results of the offset current measured by the current detection circuit in three equivalent circuits.

As described above, the high-pass filter 402 of the present disclosure is supplied with the excitation signal of the excitation signal source 451 as the reference potential. With this configuration, it is possible to reduce the offset current measured by the I-V conversion circuit 403 and perform more accurate touch detection. FIG. 13 illustrates simulation results of the offset current measured by the current detection circuit 435 in three equivalent circuits. The offset current is a current flowing through the current detection circuit 435 when no touch is made. This offset current is also referred to as a baseline current.

The three equivalent circuits are: the circuit of Comparison Example 1 not including the high-pass filter as in FIG. 7; the equivalent circuit of the present disclosure illustrated in FIG. 6; and a circuit having the same configuration as the equivalent circuit of the present disclosure illustrated in FIG. 6 except that the high-pass filter 402 thereof is supplied with the ground potential as a reference potential.

In FIG. 13, the bar 131 indicates the offset current of the circuit of Comparison Example 1, and the bar 132 indicates the offset current of the circuit in which the ground potential is given to the high-pass filter 402 as the reference potential. The bar 133 indicates the offset current of the circuit of the present disclosure in which the excitation signal is given to the high-pass filter 402 as the reference potential. The capacitance value C1 of the capacitance element 421 of the high-pass filter 402 is 10 nF, and the resistance value R of the resistance element 422 is 1.5 kΩ.

As the graph of FIG. 13 indicates, by giving the excitation signal as the reference potential to the high-pass filter 402, it is possible to greatly reduce the offset current measured by the I-V conversion circuit 403.

Figure 14:
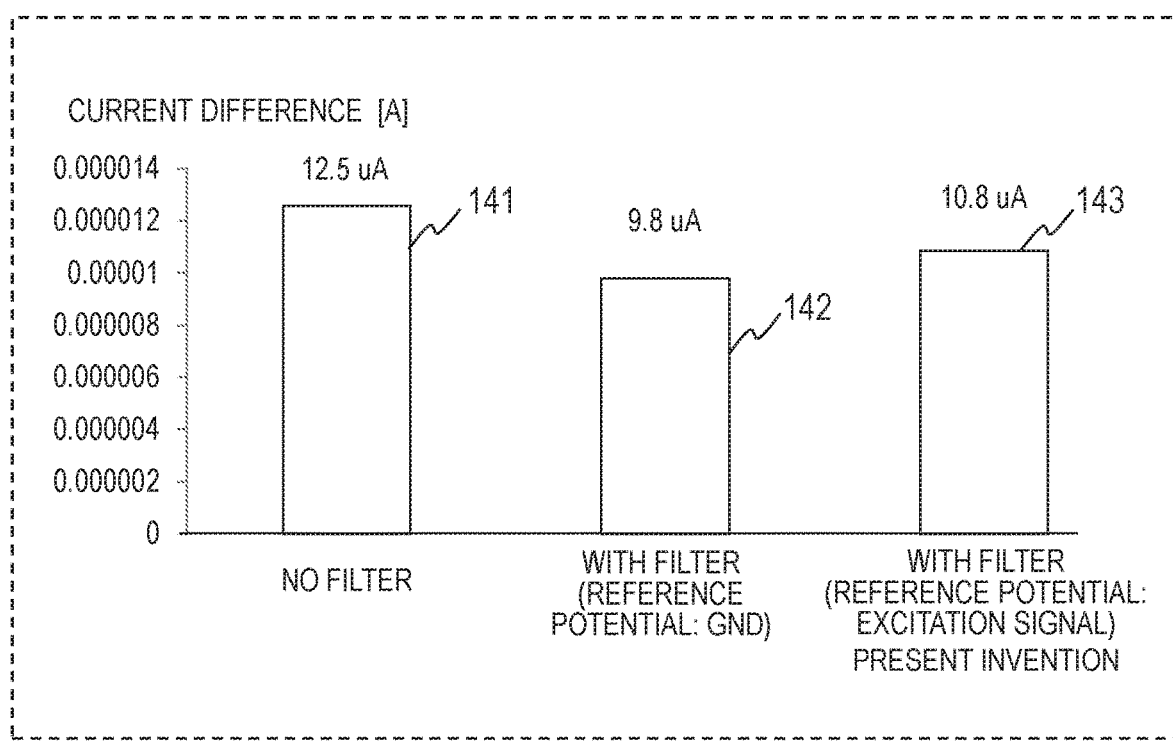
FIG. 14 illustrates the simulation results.

Furthermore, a simulation was performed on those three equivalent circuits to study the current difference between the current measured by the current detection circuit 435 when no touch is made and the current measured by the current detection circuit 435 when a touch is made. FIG. 14 illustrates the simulation results.

In FIG. 14, the bar 141 indicates the current difference of the circuit of Comparison Example 1, and the bar 142 indicates the current difference of the circuit in which the ground potential is given to the high-pass filter 402 as the reference potential. The bar 143 indicates the current difference of the circuit of the present disclosure in which the excitation signal is given to the high-pass filter 402 as the reference potential.

As the graph of FIG. 14 indicates, by giving the excitation signal as the reference potential to the high-pass filter 402, it is possible to obtain a current difference required for touch detection and to achieve a larger current difference than the case in which the ground potential is given to the high-pass filter 402.

Below, another configuration example of the high-pass filter of the present disclosure will be explained. The example explained below includes two types of passive circuit elements in a manner similar to the high-pass filter 402. The passive circuit element is a capacitance element, a resistance element, or inductance element.

Figure 15:
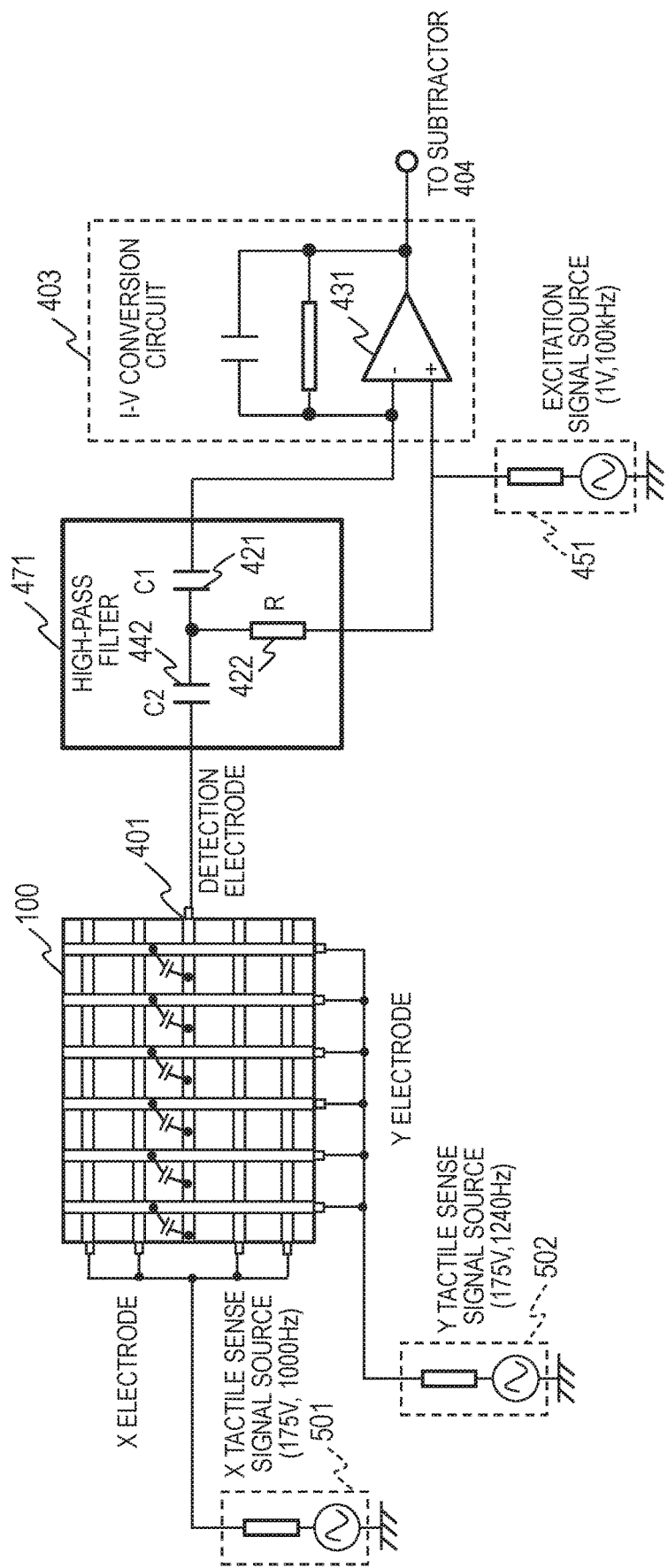
FIG. 15 illustrates a high-pass filter of another configuration example of the present disclosure.

FIG. 15 illustrates a high-pass filter of another configuration example of the present disclosure. The high-pass filter 471 includes the second capacitance element 442 in addition to the configuration of the high-pass filter 402. The capacitance value C2 of the second capacitance element 442 may be the same as or differ from the capacitance value C1 of the first capacitance element 421.

The second capacitance element 442 is connected in series with the first capacitance element 421 and the detection electrode 401 between the detection electrode 401 and the connection node of the resistance element 422. With the high-pass filter 471 of FIG. 15 as well, the noise component having a frequency lower than the frequency of the excitation signal can be effectively reduced while suppressing an increase in the offset current.

Figure 16:
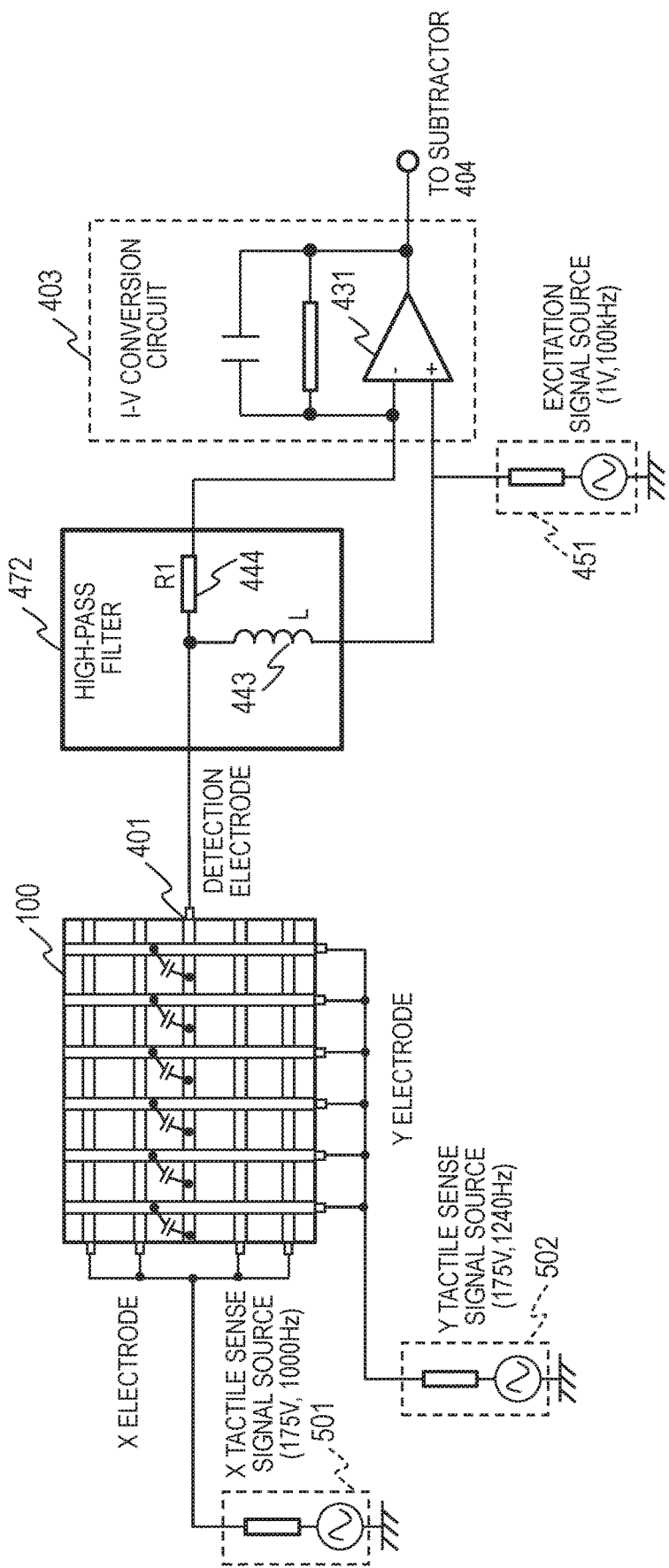
FIG. 16 illustrates a high-pass filter of another configuration example of the present disclosure.

FIG. 16 illustrates a high-pass filter of another configuration example of the present disclosure. The high-pass filter 472 is constituted of an inductance element (inductor) 443 and a resistance element 444 (LR high-pass filter). The inductance of the inductance element 443 is indicated with L, and the resistance value of the resistance element 444 is indicated with R1.

The resistance element 444 is connected in series to the detection electrode 401 and the I-V conversion circuit 403 between the detection electrode 401 and the I-V conversion circuit 403. The inductance element 443 is connected in series with a node between the detection electrode 401 and the resistance element 444 and the excitation signal source 451 between the node and the excitation signal source 451.

With the high-pass filter 472 of FIG. 16 as well, the noise component having a frequency lower than the frequency of the excitation signal can be effectively reduced while suppressing an increase in the offset current. As described above, the high-pass filter may use either one of the capacitance element and the inductance element as a reactance element.

Figure 17:
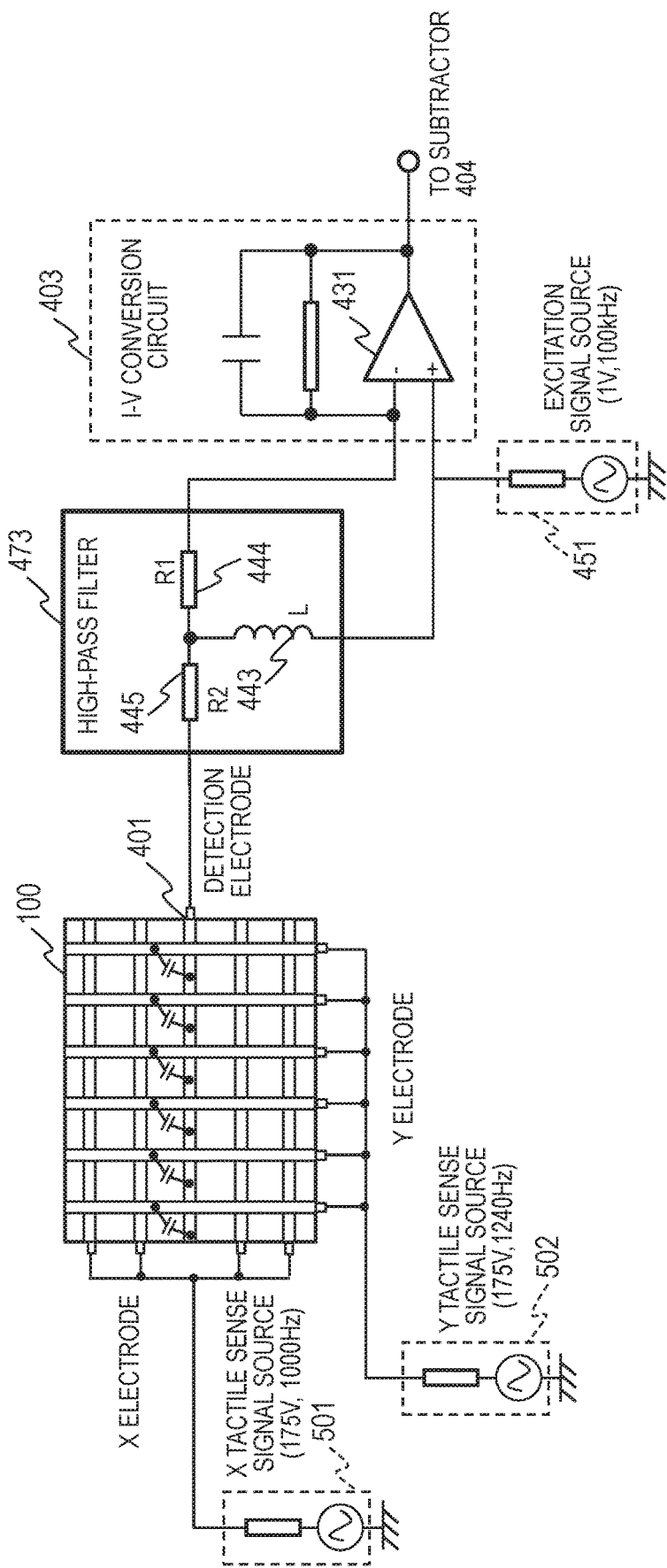
FIG. 17 illustrates a high-pass filter of another configuration example of the present disclosure.

FIG. 17 illustrates a high-pass filter of another configuration example of the present disclosure. The high-pass filter 473 includes the second resistance element 445 in addition to the configuration of the high-pass filter 472. The resistance value R2 of the second resistance element 445 may be the same as or differ from the resistance value R1 of the first resistance element 444.

The second resistance element 445 is connected in series with the first resistance element 444 and the detection electrode 401 between the connection node of the resistance element 444 and the detection electrode 401. With the high-pass filter 473 of FIG. 17 as well, the noise component having a frequency lower than the frequency of the excitation signal can be effectively reduced while suppressing an increase in the offset current.

At least a part of the features of the present disclosure can be applied to control a touch panel configured to perform only touch position detection, without presenting a texture feeling. For example, the touch panel driver 351 including a high-pass filter of the present disclosure may be applied to a touch panel device that does not have the tactile sense presentation function.

Parameter values (capacitance value, resistance value, and inductance value) of the high-pass filter depend on the design of the device. In the device having the tactile sense presentation function as described above, the parameters of the high-pass filter are set so as to block the frequency component of the tactile sense signal, which is the main noise. Even in a touch panel device that does not have the tactile sense presentation function, the parameters of the high-pass filter are set so that noise that adversely affects the touch detection is blocked.

The features of the present disclosure may be applied to electrostatic capacitance sensor devices differing from a touch panel device. For example, the features of the present disclosure may be applied to a capacitance detection circuit of an electrostatic capacitance sensor device such as a touch switch, a touch pad, a human body proximity sensor of the electrostatic capacitance type, and a liquid detection sensor of electrostatic capacitance type.

As set forth above, embodiments of this disclosure have been described; however, this disclosure is not limited to the foregoing embodiments. Those skilled in the art can easily modify, add, or convert each element in the foregoing embodiment within the scope of this disclosure. A part of the configuration of one embodiment can be replaced with a configuration of another embodiment or a configuration of an embodiment can be incorporated into a configuration of another embodiment.

What is claimed is:

1. A capacitance detection circuit that measures a current from a detection electrode in order to measure a self-capacitance of the detection electrode, comprising:
    an excitation signal source configured to supply an AC driving voltage to drive the detection electrode;
    a high-pass filter configured to cause a current signal input from the detection electrode to be output after being attenuated in a prescribed frequency region that is lower than a frequency of the excitation signal source; and
    a current signal measurement circuit connected between the high-pass filter and the excitation signal source, the current signal measurement circuit being configured to measure a current signal from the high-pass filter, wherein the high-pass filter comprises:
a first passive circuit element connected in series between the detection electrode and the current signal measurement circuit; and
a second passive circuit element connected in series between the excitation signal source and a node between the detection electrode and the first passive circuit element.

2. The capacitance detection circuit according to claim 1, wherein the first passive circuit element is a capacitance element, and
wherein the second passive circuit element is a resistance element.

3. The capacitance detection circuit according to claim 2, wherein the current signal measurement circuit is a current voltage conversion circuit including an operation amplifier,
wherein an inverting input of the operation amplifier is connected to the capacitance element,
wherein the excitation signal source is connected to a non-inverting input of the operation amplifier, and
wherein a second resistance element is connected between an inverting input and an output of the operation amplifier.

4. The capacitance detection circuit according to claim 1, wherein the first passive circuit element is a resistance element, and
wherein the second passive circuit element is an inductance element.

5. The capacitance detection circuit according to claim 1, wherein the capacitance detection circuit is configured to measure the self-capacitance of the detection electrode of a touch panel,
wherein the touch panel includes a plurality of detection electrodes for identifying a touch position,
wherein the capacitance detection circuit measures a current from a detection circuit selected from the plurality of electrodes,
wherein an AC signal for presenting a tactile sense is input into a detection electrode that differs from said detection electrode selected by the capacitance detection circuit, and
wherein a frequency of the AC signal for presenting a tactile sense is within the prescribed frequency region.

6. An electrostatic capacitance sensor device, comprising:
a detection electrode; and
a controller configured to measure a current from the detection electrode in order to measure a self-capacitance of the detection electrode,
wherein the controller comprises:
an excitation signal source configured to supply an AC driving voltage to drive the detection electrode;
a high-pass filter configured to cause a current signal input from the detecting electrode to be output after being attenuated in a prescribed frequency region that is lower than a frequency of the excitation signal source; and
a current signal measurement circuit connected between the high-pass filter and the excitation signal source, the current signal measurement circuit being configured to measure a current signal from the high-pass filter, and
wherein the high-pass filter comprises:
a first passive circuit element connected in series between the detection electrode and the current signal measurement circuit; and
a second passive circuit element connected in series between the excitation signal source and a node between the detection electrode and the first passive circuit element.

7. The electrostatic capacitance sensor device according to claim 6, wherein the first passive circuit element is a capacitance element, and
wherein the second passive circuit element is a resistance element.

8. The electrostatic capacitance sensor device according to claim 6, wherein the first passive circuit element is a resistance element, and
wherein the second passive circuit element is an inductance element.

9. The electrostatic capacitance sensor device according to claim 6,
comprising a touch panel including a plurality of detection electrodes that include said detection electrode,
wherein the controller is configured to:
measure a current from a detection circuit sequentially selected from the plurality of electrodes; and
supply an AC signal for presenting a tactile sense to a detection electrode that differs from the detection electrode selected for the current measurement, and
wherein a frequency of the AC signal for presenting a tactile sense is within the prescribed frequency region.

* * * * *